United States Patent [19]

Harris et al.

[11] Patent Number: 5,229,917

[45] Date of Patent: Jul. 20, 1993

[54] VLSI INTEGRATION INTO A 3-D WSI DUAL COMPOSITE MODULE

[75] Inventors: David B. Harris; Scott P. Karr, both of Columbia; Stephen J. Reinhart, Annapolis, all of Md.

[73] Assignee: The United States of America as represented by the Secretary of the Air Force, Washington, D.C.

[21] Appl. No.: 920,623

[22] Filed: Jul. 24, 1992

[51] Int. Cl.⁵ .............................................. H05K 7/20
[52] U.S. Cl. .................................... 361/386; 361/388; 361/396; 361/412; 361/413; 439/66
[58] Field of Search ....................... 361/386, 388–389, 361/392–396, 412, 413; 439/65, 66

[56] References Cited

U.S. PATENT DOCUMENTS

| | | | |
|---|---|---|---|
| 4,730,232 | 3/1988 | Lindberg | 361/392 |
| 4,811,082 | 3/1989 | Jacobs et al. | 357/80 |
| 4,812,949 | 3/1989 | Fontan et al. | 361/386 |
| 4,890,153 | 12/1989 | Wu | 357/74 |
| 4,901,136 | 2/1990 | Neugebauer et al. | 357/75 |
| 4,937,659 | 6/1990 | Chall, Jr. | 357/74 |
| 4,965,653 | 10/1990 | Otsuka et al. | 357/55 |
| 5,040,994 | 8/1991 | Nakamoto et al. | 361/395 |
| 5,050,039 | 9/1991 | Edfors | 361/398 |
| 5,157,588 | 10/1992 | Kim et al. | 361/412 |

Primary Examiner—Gregory D. Thompson
Attorney, Agent, or Firm—William G. Auton; Donald J. Singer

[57] ABSTRACT

The difficulty with integrating packaged devices into a dual composite module design for wafer scale devices is the height difference between the WSI and packaged devices a typical wafer scale device is 0.025 (in) high while typical packaged VLSI components are 0.080 (in) or more. This leaves little room for the other 5 layers of interconnect boards and PCI layers required for the dual composite module. The solution is that the PWB on the side of the composite heat sink has been shortened to support only the wafer scale device on the heat sink. This eliminated PWB thickness and PCI interfaces from the side with the VLSI components. Also 3-P connectors are made with a pressure contact interconnecting (PCI) board.

5 Claims, 2 Drawing Sheets

VLSI INTEGRATION INTO A 3-D WSI DUAL COMPOSITE MODULE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to very large scale integration (VLSI) circuits, and more specifically the invention pertains to a method of packaging wafer scale integration (WSI) devices.

The use of VLSI chips for the miniaturization of complex electronic equipment has brought about new kinds of problems. Wafer scale integration has been a desired packaging alternative primarily because it has the capability for achieving extremely dense integrated circuit packaging and high circuit speeds. Most of the recent wafer scale integration packaging schemes have not been widely used in industry because of the difficulty with integrating packaged devices into a dual composite module design.

The difficulty with integrating packaged devices into a dual composite module design for wafer scale devices is the height difference between the WSI and packaged devices. A typical wafer scale device is 0.025 (in) high while typical packaged VLSI components are 0.080 (in) or more. This leaves little room for the other 5 layers of interconnect boards and PCI layers required for the dual composite module.

The task of integrating VLSI circuits into a 3-D dual composite module is alleviated, to some extent, by the systems disclosed in the following U.S. Patents, the disclosures of which are incorporated herein by reference:

U.S. Pat. No. 4,811,082 issued to Jacobs et al;
U.S. Pat. No. 4,812,949 issued to Fonan et al;
U.S. Pat. No. 4,890,153 issued to Wu;
U.S. Pat. No. 4,901,336 issued to Neugebauer et al;
U.S. Pat. No. 4,937,659 issued to Chall; and
U.S. Pat. No. 4,965,653 issued to Otsuka et al.

The Otsuka et al patent discloses a WSI in which a slit formed in a wafer is fit to a connector while the Chall patent discloses VLSI low cost construction. The patents to Jacobs et al, Fontan et al, Wu, and Neugebauer et al are of interest, in that they disclose VLSI and WSI state of the art technology.

While the above-cited references are instructive, none of the cited patents disclose reduction of package thickness 0.29 (in) for dual composite module in order to meet the equivalent module size, for dual composite module construction. The task of redesigning VLSI circuits so that they are integrated into 3-D dual composite modules represents a current technical need. The present invention is intended to help satisfy that need.

SUMMARY OF THE INVENTION

The present invention includes a method for packaging WSI devices. As mentioned above, the difficulty with integrating packaged devices into a dual composite module design for wafer scale devices is the height difference between the WSI and packaged devices. A typical wafer scale device is 0.025 (in) high while typical packaged VLSI components are 0.080 (in) or more. This leaves little room for the other 5 layers of interconnect boards and PCI layers required for the dual composite module. The solution is that the PWB on the side of the composite heat sink has been shortened to support only the wafer scale device on the heat sink. This eliminates PWB thickness and two PCI interfaces from the side with the VLSI components. Also 3-P connectors are made with a pressure contact interconnecting (PCI) board.

The present invention is a method of packaging two sets of wafer scale integration devices and a set of VLSI devices into a dual composite module with a height of less than or equal to 0.29 inches. The 7 layer device includes two sets of wafer scale integration devices and a set of VLSI devices which are electrically connected to each other using three pressure contact interconnect layers and two interconnect boards.

The first circuit board of the dual composite module has WSI devices mounted on one half of its top surface, and VLSI devices mounted on the other half of its top surface. A foreshortened PCI board only covers and is electrically connected to the comparatively short WSI devices on the first circuit board. This is connected to a foreshortened interconnect board, which only covers the foreshortened pressure contact interconnect board.

A first full size pressure contact interconnect board covers and is electrically connected to both the VLSI devices of the first circuit board, and the foreshortened interconnect board. A second full size contact interconnect board and a full size interconnect board serve as a means to connect the first full size pressure interconnect board with a second circuit board (which contains only WSI devices on its bottom surface and a heat sink on its top surface).

The dual composite modules are produced by a packaging process that has two basic steps. The first step entails producing two wafer scale integration devices in which the two sets of silicon wafers are bonded respectively to two heat sink metal substrates which each have the minimum thickness required to absorb heat and prevent thermally generated interference. This "minimum thickness" may be determined empirically by: estimating an appropriate thickness; then testing the WS circuit to see if the heat sink is sufficiently thermally absorptive; and reestimating the appropriate thickness until the minimum is reached.

The second step of the process entails electrically connecting the two sets of wafer scale integration devices and the VLSI devices into a dual composite module which has a total thickness that does not exceed 0.29 inches. This second step is performed using three PCI interface boards, and two interconnect boards.

It is an object of the present invention to produce dual composite modules which have a height that does not exceed 0.29 inches.

This object together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

Figure 1:
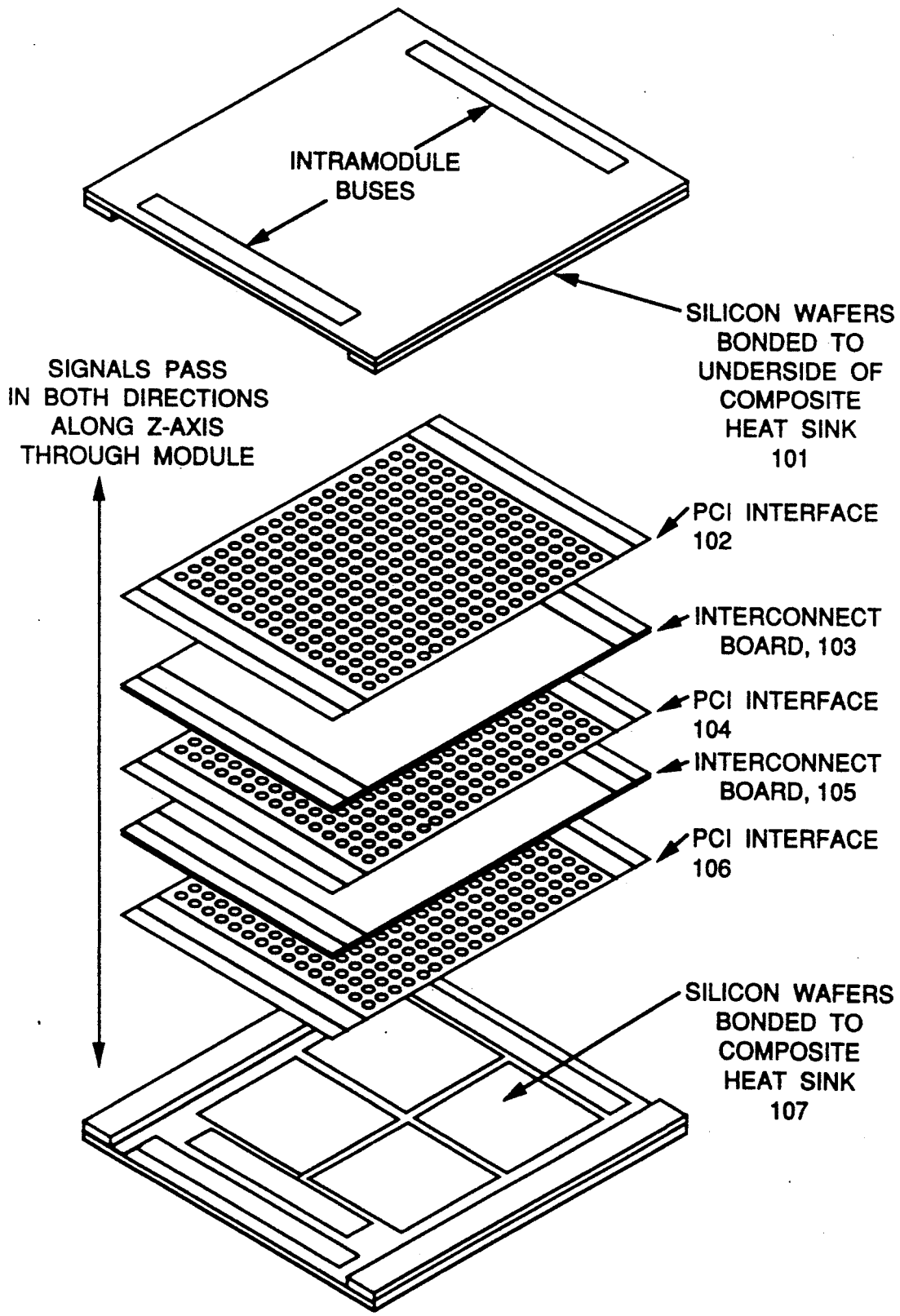
FIG. 1 is an illustration of a dual composite module using PC technology.

The present invention includes a method for packaging WSI devices into a dual composite module. For some time now, Westinghouse has been exploring methods of packaging WSI devices. One method is to incorporate WSI devices into SEM-E equivalent modules called dual composite modules. A dual composite module is equal in size to half a SEM-E module (two dual composite modules are stacked together to form a SEM-E equivalent module). The dual composite module can be most easily understood by visualizing a simplified cross-section of the module. The structure can be pictured as being similar to a sandwich. The outer members (ie. the 2 pieces of bread are formed out of a composite material and serve as the heat sinks for the module. Several WSI devices are formed out of a composite material and serve as the heat sinks for the module. Several WSI devices are bonded to the inside surface of the heat sinks. The heat sinks also act as integral covers for the module. In the center of the sandwich two flat, multilayer interconnect boards carry signals to and from the devices. Between every layer of the dual composite module there is pressure contact interconnect (PCI) layer. This layer can either be a uniaxially conductive elastomer or a rigid plastic carrier with compliant buttons arranged in a pattern to match the I/O pattern of the interconnect board and the WSI devices. The PCI layers serve to pass signals through the module in the Z-axis. The PCI interface is the key to 3-D packaging technology and eliminates the use of a conventional backplane/matrix plate to carry signals within the module. For the purposes of this disclosure, it will be assumed that the pressure contact interface is a button carrier. FIG. 1 gives a detailed exploded view of the dual composite module using PCI technology.

The dual composite module of FIG. 1 is composed of seven boards 101–107. Both the top and bottom boards 101 and 107 include silicon wafers which are bonded to a composite heat sink. The silicon wafers are batch fabricated circuits which form components including transistors, diodes and diffused resistors in a integrated circuit design. The heat sinks are graphite composite mounting bases that dissipate the heat generated by the semiconductor devices.

The pressure contact interface boards 102 and 106 respectively electrically connect the two top and bottom boards 101 and 107 to their respective interconnect boards 103 and 105 and to the central PCI interface 104. Electrical signals are able to pass in both directions along the Z axis through the module of FIG. 1.

Figure 2:
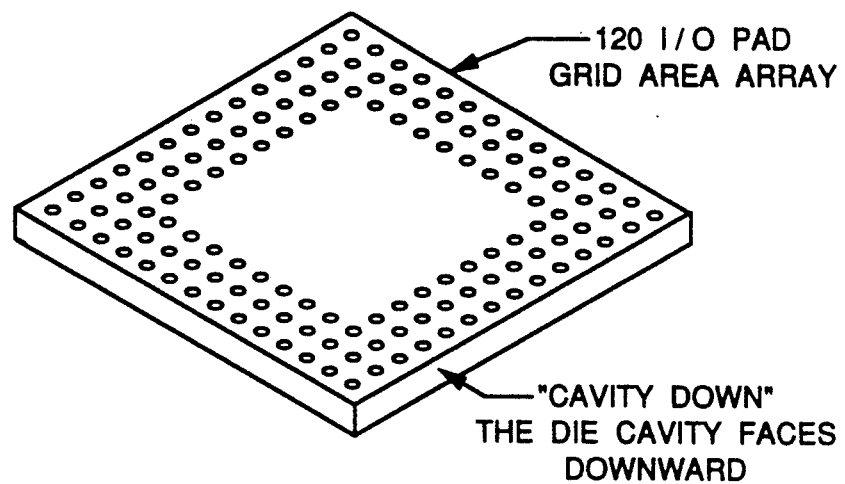
FIG. 2 is a typical VLSI device.

FIG. 2 shows what a typical VLSI device might look like. The difficulty with integrating packaged devices into a dual composite module designed for wafer scale devices is the height difference between the WSI and packaged devices. A typical wafer scale device is 0.025 (in) high while typical packaged VLSI components are 0.080 (in) or more. This leaves little room for the other 5 layers of interconnect boards and PCI layers required in the dual composite module. In order to make the dual composite module equivalent in size to half a SEM-E, which is 0.600 (in) thick, the height must be 0.290 (in). (A 0.010 (in) space in each module is reserved for dimensional tolerances of the PCI layer which passes signals from module-to-module.)

Figure 3:
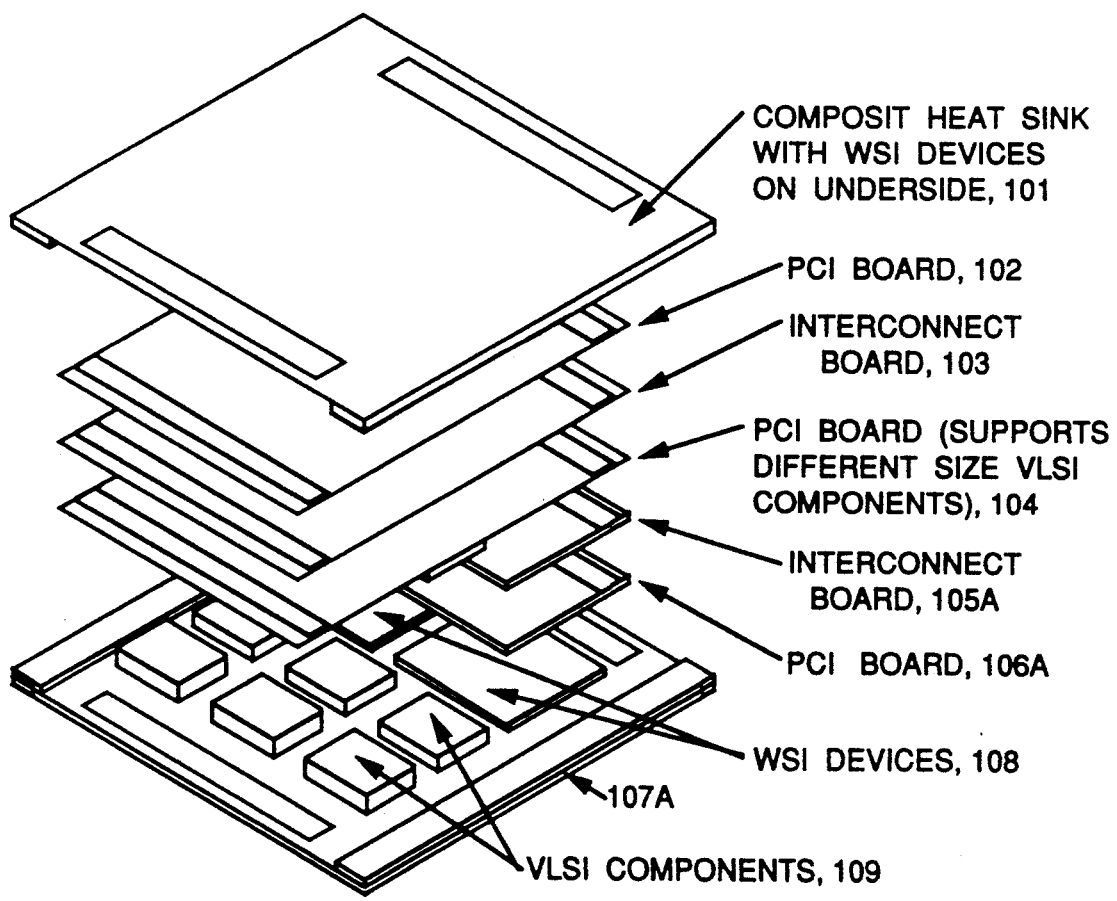
FIG. 3 is a dual composite module produced by the process of the present invention.

A unique method for packaging these devices has been developed. FIG. 1 showed what a typical dual composite module looks like using PCI technology. A modified version of this has been developed to incorporate VLSI components. As can be seen in FIG. 3, the PWB on the side of the composite heat sink has been shortened to support only the wafer scale device on that heat sink. The VLSI components are supported by the PWB used for the wafers on the opposing heat sink. This eliminates 1 PWB thickness and 2 PCI interfaces from the side with the VLSI components. With this design, the dual composite module can support packaged devices up to a height of 0.090 (in) while keeping the 0.29 (in) thickness required for SEM-E compatibility.

FIG. 3 is an illustration of the product produced by the preferred embodiment of the present invention. The present invention is a method of packaging two wafer scale integration devices into a dual composite module with a height of less than or equal to 0.29 inches. The 7 board device of FIG. 3 includes four wafer scale integration devices mounted on two boards 101 and 107A which are electrically connected to each other using three pressure contact interconnect layers 102 and 106A, and two interconnect boards 105A and 103. One pressure contact interconnect layer 106A and one interconnect board 105A has been foreshortened so that they make room for the VLSI devices 109 on board 107A.

The circuit board 107A of the dual composite module has WSI devices 108 mounted on one half of its top surface, and VLSI devices 109 mounted on the other half of its top surface. A foreshortened PCI board 106A only covers and is electrically connected to the comparatively short WSI devices on the first circuit board 107A. This is connected to a foreshortened interconnect board 105A, which only covers the foreshortened pressure contact interconnect board 106A.

A first full size pressure contact interconnect board 104 covers and is electrically connected to both the VLSI devices 109 of the first circuit board 107A, and the foreshortened interconnect board 105A. A second full size contact interconnect board 103 and a full size interconnect board 102 serve as a means to connect the first full size pressure circuit board 107A with a second circuit board 101 (which contains only WSI devices on its bottom surface and a heat sink on its top surface).

The second wafer scale integration device on the top board 101 includes silicon wafers bonded to the underside of a heat sink, with intramodule bases serving as ohmic contacts that connect the wafers to external devices. All of the active devices (transistors, resistors, diodes etc.) of the dual composite module are fabricated in the silicon wafers of the four wafer scale integration devices mounted on two boards 101 and 107A. As mentioned above, the heat sink of the wafer scale integration device is shortened to reduce the overall thickness of the dual composite module. The amount that the heat sink is reduced may be determined on two factors. First, it is crucial that the final thickness of the dual composite module does not exceed 0.29 inches. Therefore the heat sink on the WSI circuit board 101 is reduced so that the thickness of the seven layers meets this goal. Secondly, the thermal insensitivity of the two WSI devices should be considered. A reduction of the heat sink thickness will reduce the ability of the heat sink to readily absorb the thermal energy produced by the semiconductor silicon wafers. The ability of the final dual composite module to function without interference by thermally generated noise is a factor that will have to be determined empirically with each circuit design.

As mentioned above, the pressure contact interconnect boards 102, 104 and 106A of FIG. 3 are either conductive elastomers or plastic sheets with compliant metal pads or buttons arranged in a pattern to match the I/O pattern of the adjacent WSI devices 101 and 107A and the interconnect board 105A. Westinghouse uses the gold pad technique where gold metal pads are loaded onto a 0.020 inch thick carrier with 0.010 inch tolerance in which they extend beyond the plastic sheet where they make electrical contact. A pattern is impressed onto the PCI interfaces 102, 104 and 106A so that the pads only protrude where they are to make electrical contact with adjacent layers on either side of the PCI interfaces 102, 104 and 106A, as described below.

Pressure Contact Interconnection (PCI) provides an alternative to direct silicon interconnection (DSI). PCI is very similar to DSI with one important difference—the interconnect boards do not directly contact the silicon wafers. Between the interconnect boards the wafers, and also between the two interconnect boards, are PCI layers as shown in FIG. 3. This PCI layer is called a pad area grid. The pad area grid is manufactured from a molded dielectric and populated with pads that match the I/O pattern of the WSI devices and the interconnect board. The pads are continuous gold plated beryllium copper wire randomly woven into a cylindrical shape. These pads are loaded into preformed holes in the carrier with the ends of the pads protruding. The pads are securely held in position by a friction fit. When compressed, each pad acts like a spring, establishing excellent contact at both ends. The contact surface of the random wire structure ensures multiple contact points and high pressure as a result of the small contact area from the fine diameter wire. FIG. 2 shows a typical pad area array with the gold buttons loaded in a "pad area" or "pad grid" array.

The foreshortened interconnect board 105A of FIG. 3 is a printed circuit board with ohmic contacts arranged in a pattern to connect the adjacent PCI interface boards 104 and 106A. The interconnect board may be bump bonded to the adjacent PCI interface boards, as described in such standard texts as "METAL SEMICONDUCTOR CONTACTS" by E. H. Rhoderick, published by Clarendon Press in 1980, the disclosure of which is incorporated herein by reference.

The dual composite module of FIG. 3 is produced by a packaging process that has two basic steps. The first step entails producing four wafer scale integration devices in which the two sets of four silicon wafers are bonded respectively to two heat sink metal substrates which each have the minimum thickness required to absorb heat an prevent thermally generated interference. This "minimum thickness" may be determined empirically by: estimating an appropriate thickness; then testing the WSI circuit to see if the heat sink is sufficiently thermally absorptive; and reestimating the appropriate thickness until the minimum is reached.

The second step of the process entails electrically connecting the four wafer scale integration devices into a dual composite module which has a total thickness that does not exceed 0.29 inches. This second step in FIG. 3 is performed using three PCI interface boards 102, and two interconnect board 105S.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A dual composite module comprising:
   a first circuit board having WSI devices mounted on one half of its top surface and VLSI devices mounted on the other half of its top surface;
   a foreshortened pressure contact interconnect board which only covers and is electrically connected to the WSI devices on the first circuit board;
   a foreshortened interconnect board which only covers and is electrically connected to the foreshortened pressure contact interconnect board;
   a first full size pressure contact interconnect board which covers and is electrically connected to both the foreshortened interconnect board and the VLSI devices of the first circuit board;
   a second circuit board having WSI devices mounted on its bottom surface; and
   a means for electrically connecting the WSI devices of the second circuit board with the first full size pressure contact interconnect board.

2. A dual composite module, as defined in claim 1, where the second circuit board has a heat sink attached to its top surface to absorb and disperse heat generated by the dual composite module.

3. A dual composite module, as defined in claim 1, wherein said connecting means comprises:
   a second full size pressure contact interconnect board which covers and is electrically connected to the WSI devices of the second circuit board; and
   a full size interconnect board which is electrically connected between the first and the second full size contact interconnect boards.

4. A dual composite module, as defined in claim 2, wherein said connecting means comprises:
   a second full size pressure contact interconnect board which covers and is electrically connected to the WSI devices of the second circuit board; and
   a full size interconnect board which is electrically connected between the first and the second full size contact interconnect boards.

5. A dual composite module which has a thickness which does not exceed 0.29 inches, and which comprises:
   a first circuit board having WSI devices mounted on one half of its top surface and VLSI devices mounted on the other half of its top surface;
   a second circuit board having WSI devices mounted on its bottom surface;
   a foreshortened pressure contact interconnect board which only covers and is electrically connected to the WSI devices on the first circuit board;
   a foreshortened interconnect board which only covers and is electrically connected to the foreshortened pressure contact interconnect board;
   a first full size pressure contact interconnect board which covers and is electrically connected to both the foreshortened interconnect board and the VLSI devices of the first circuit board;
   a second full size pressure contact interconnect board which covers and is electrically connected to the WSI devices of the second circuit board; and
   a full size interconnect board which is electrically connected between the first and the second full size contact interconnect boards.

* * * * *